(12) United States Patent
Stiepan et al.

(10) Patent No.: US 10,422,718 B2
(45) Date of Patent: Sep. 24, 2019

(54) TEST DEVICE AND METHOD FOR TESTING A MIRROR

(71) Applicant: Carl Zeiss SMT GmbH, Oberkochen (DE)

(72) Inventors: Hans-Michael Stiepan, Aalen (DE); Jochen Hetzler, Aalen (DE); Sebastian Fuchs, Aalen (DE)

(73) Assignee: CARL ZEISS SMT GMBH, Oberkochen (DE)

( * ) Notice: Subject to any disclaimer, the term of this patent is extended or adjusted under 35 U.S.C. 154(b) by 87 days.

(21) Appl. No.: 15/676,729

(22) Filed: Aug. 14, 2017

(65) Prior Publication Data

US 2017/0343449 A1 Nov. 30, 2017

Related U.S. Application Data

(63) Continuation of application No. PCT/EP2016/051957, filed on Jan. 29, 2016.

(30) Foreign Application Priority Data

Feb. 13, 2015 (DE) .................. 10 2015 202 695

(51) Int. Cl.
*G01M 11/00* (2006.01)
*G01M 11/02* (2006.01)
(Continued)

(52) U.S. Cl.
CPC ........... *G01M 11/005* (2013.01); *G01B 9/021* (2013.01); *G01B 9/02038* (2013.01);
(Continued)

(58) Field of Classification Search
CPC ............ G01B 9/02038; G01B 9/02085; G01B 9/021; G01B 9/023; G01M 11/005; G01M 11/0271; G03F 7/706
See application file for complete search history.

(56) References Cited

U.S. PATENT DOCUMENTS 7,538,856 B2 5/2009 Kajiyama et al.
7,936,521 B2 5/2011 Arnold et al.
(Continued)

FOREIGN PATENT DOCUMENTS

DE 102008048844 A1 5/2009
DE 102012217800 A1 4/2014
(Continued)

OTHER PUBLICATIONS

International Preliminary Report on Patentability and Written Opinion in counterpart International Application No. PCT/EP2016/051957, dated Aug. 15, 2017, 15 pages.
(Continued)

*Primary Examiner* — Michael A Lyons
(74) *Attorney, Agent, or Firm* — Edell, Shapiro & Finnan, LLC

(57) ABSTRACT

A test appliance and a method for testing a mirror, e.g., a mirror of a microlithographic projection exposure apparatus. The test appliance has a computer-generated hologram (CGH), and a test can be carried out on at least a portion of the mirror by way of an interferometric superposition of a test wave that is directed onto the mirror by this computer-generated hologram and a reference wave. Here, the computer-generated hologram (CGH) (120, 320) is designed in such a way that, during operation of the appliance, it provides a first test wave for testing a first portion of the mirror (101, 301) by interferometric superposition with a reference wave in a first position of the mirror (101, 301) and at least a second test wave for testing a second portion of the mirror (101, 301) by interferometric superposition with a reference wave in a second position of the mirror (101, 301).

18 Claims, 7 Drawing Sheets

(51) Int. Cl.
*G03F 7/20* (2006.01)
*G01B 9/02* (2006.01)
*G01B 9/021* (2006.01)

(52) U.S. Cl.
CPC ..... *G01B 9/02085* (2013.01); *G01M 11/0271* (2013.01); *G03F 7/706* (2013.01)

(56) References Cited

U.S. PATENT DOCUMENTS

| | | | |
|---|---|---|---|
| 8,089,634 B2 | 1/2012 | Hetzler et al. | |
| 2005/0275849 A1* | 12/2005 | Freimann | G01M 11/005 356/521 |
| 2008/0043247 A1* | 2/2008 | Arnold | G01B 11/2441 356/512 |
| 2009/0079992 A1 | 3/2009 | Doerband | |
| 2009/0231593 A1 | 9/2009 | Freimann et al. | |
| 2010/0177320 A1* | 7/2010 | Arnold | G01B 9/021 356/512 |
| 2010/0195178 A1* | 8/2010 | Leister | G03H 1/02 359/11 |
| 2012/0170038 A1 | 7/2012 | Bourgois et al. | |
| 2015/0198438 A1 | 7/2015 | Hetzler | |

FOREIGN PATENT DOCUMENTS

| | | |
|---|---|---|
| DE | 102015202676 A1 | 8/2016 |
| DE | 102015209490 A1 | 11/2016 |
| WO | 2016188620 A2 | 12/2016 |

OTHER PUBLICATIONS

Beyerlein, M.; Lindlein N.; Schwider, J.: "Dual-wave-front computer generated holograms für quasi-absolute testing of aspherics", Appl. Opt. (USA) 41, p. 2440 (2002).
International Search Report & Written Opinion for PCT/EP2016/051957, dated Jun. 15, 2016.
Office Action in corresponding German Application 10 2015 202 695.7, dated Dec. 18, 2015, along with English Translation.
EP Office Action, EP Application 16 703 455.2, dated Jul. 20, 2018, 6 pages.

* cited by examiner

TEST DEVICE AND METHOD FOR TESTING A MIRROR

CROSS REFERENCE TO RELATED APPLICATIONS

The present application is a Continuation of International Application No. PCT/EP2016/051957, filed Jan. 29, 2016, which claims the priority of the German patent application DE 10 2015 202 695.7, filed on Feb. 13, 2015. The disclosures of both related applications are considered part of and are incorporated by reference into the disclosure of the present application in their respective entireties.

FIELD OF THE INVENTION

The invention relates to a test appliance and a method for testing a mirror, in particular a mirror of a microlithographic projection exposure apparatus.

BACKGROUND

Microlithography is used for producing microstructured components such as, for example, integrated circuits or LCDs. The microlithography process is carried out in what is called a projection exposure apparatus, which comprises an illumination device and a projection lens. The image of a mask (reticle) illuminated by the illumination device is in this case projected by the projection lens onto a substrate (e.g. a silicon wafer) coated with a light-sensitive layer (photoresist) and arranged in the image plane of the projection lens, in order to transfer the mask structure to the light-sensitive coating of the substrate.

In projection lenses designed for the EUV range, i.e. at wavelengths of e.g. approximately 13 nm or approximately 7 nm, owing to the lack of availability of suitable light-transmissive refractive materials, mirrors are used as optical components for the imaging process. Typical projection lenses designed for EUV, as known e.g. from U.S. Pat. No. 7,538,856 B2, may have for example an image-side numerical aperture (NA) in the range of NA=0.2 to 0.3 and image an (e.g. ring-segment-shaped) object field into the image plane or wafer plane.

Here, inter alia, the operation of mirrors under grazing incidence is also known. Such mirrors operated under grazing incidence, which it is desirable to use chiefly in respect of the comparatively high obtainable reflectivities (e.g. of 80% and more), are understood to mean e.g. mirrors for which the reflection angles, which occur during the reflection of the EUV radiation and relate to the respective surface normal, are at least 65°. Such mirrors are also referred to as GI mirrors ("grazing incidence").

The increase of the image-side numerical aperture (NA) and the realization of arrangements using GI mirrors are typically accompanied by an enlargement of the required mirror areas of the mirrors used in the projection exposure apparatus.

In particular, the use of computer-generated holograms (CGH) is known for highly precise testing of the mirrors.

FIG. 5 initially shows a schematic illustration for explaining a possible functional principle of a conventional interferometric test arrangement for testing a mirror 501.

In accordance with FIG. 5, an interferogram between a reference light (reference wave) that is reflected at a reference surface 510 ("Fizeau plate") and a measurement light (test wave) that is reflected at the mirror 501 is produced in a Fizeau arrangement. Here, the measurement light is formed into an aspherical wavefront by a computer-generated hologram (CGH) 520, said wavefront corresponding mathematically exactly to the "test object form" (i.e. the form of the relevant mirror 501) at an intended distance. The wavefronts reflected firstly by the reference surface 510 and secondly by the relevant mirror 501 or test object interfere with one another in an interferometer 505 (which is schematically illustrated by way of example in terms of its overall design in FIG. 6), with a collimator 509, a beam splitter plate 508, a stop 507, an eyepiece 506 and a CCD camera 504 and a light source 503 for the interferometer 505 being depicted in FIG. 6. An interferogram of the respective mirror is recorded by the CCD camera 504.

The problem occurring here in practice with increasing mirror dimension, in particular in the case of GI mirrors or concave mirrors, is that the realization of ever larger CGHs has limits, with typical CGH dimensions being able to be e.g. 6 inch (=15.24 cm) or 9 inch (=22.86 cm). Although, in this respect, it is possible to use a plurality of CGHs for different, successively set mirror positions to reduce the required CGH dimensions, additional practical problems emerge in this case, with, in particular, the lengthening of the time duration required for the entire test and also the necessity of an exact combination of the measurement results obtained for the different mirror regions being mentioned.

Moreover, in the case of using a plurality of CGHs for testing one and the same mirror, it was found to be increasingly difficult to reliably distinguish between the manufacturing errors that are typically present in the CGHs and the mirror errors that are to be ascertained within the scope of the test, as a result of which the accuracy of the test is impaired. If a plurality of CGHs are used, further difficulties emerge from the relative degrees of freedom in terms of adjustment (i.e. distances and relative orientation) between CGH and mirror.

Moreover, the realization of a calibration of the CGHs that are used in the mirror test by using so-called complex-encoded CGHs is known, wherein at least one further "calibration functionality" for providing a reference wavefront that serves for calibration or error correction is encoded at the same position in one and the same CGH in addition to the "use functionality" (i.e. the CGH structure that is designed in accordance with the mirror form for forming the wavefront that mathematically corresponds to the test object form) that is required for the actual test.

In respect of the prior art, reference is made in a purely exemplary manner to U.S. Pat. No. 7,936,521 B2, U.S. Pat. No. 8,089,634 B2 and the article Beyerlein, M.; Lindlein, N.; Schwider, J.: "Dual-wave-front computer-generated holograms for quasi-absolute testing of aspherics", Appl. Opt. (USA) 41, page 2440 (2002).

SUMMARY

Against the aforementioned background, it is an object of the present invention to provide a test appliance and a method for testing a mirror which facilitate a reliable test of even comparatively large mirror surfaces while at least partly avoiding the problems described above.

This object is achieved by the features of the independent patent claims.

In a test appliance according to the invention for testing a mirror, in particular a mirror of a microlithographic projection exposure apparatus, wherein the test appliance comprises a computer-generated hologram (CGH) and wherein a test can be carried out on at least a portion of the mirror by way of an interferometric superposition of a test wave that is directed onto the mirror by this computer-generated hologram and a reference wave, the computer-generated hologram is designed in such a way that, during operation of the appliance, it provides a first test wave for testing a first portion of the mirror by interferometric superposition with a reference wave in a first position of the mirror and at least a second test wave for testing a second portion of the mirror by interferometric superposition with a reference wave in a second position of the mirror.

In particular, the invention is based on the concept of combining a plurality of "use functionalities" within one and the same CGH used for testing the mirror, said use functionalities in each case being assigned to different geometric regions on the mirror to be measured (i.e. different measurement positions of the mirror or of the test object in the respective test arrangement). In so doing, the term "use functionality" is respectively understood to mean—both here and below—a CGH structure which (e.g. in the form of a spatially varying line grating) forms the respective wavefront which corresponds to the "test object form" in a specific region or on a specific portion of the mirror to be tested and which is hence suitable for the interferometric testing of this region of the mirror.

Here, the combination according to the invention of the aforementioned use functionalities in one and the same CGH can be realized using the concept of complex encoding, which is known per se, wherein, however, a plurality of different use functionalities are used for testing different mirror regions (i.e. not merely for the purposes of calibration when testing one and the same mirror region) according to the invention in contrast to the conventional complex-encoded CGHs that are described at the outset.

Expressed differently, the test wave is used for a first region of the mirror surface (e.g. a "left half of the mirror") or the test wave is used for a second region of the mirror surface (e.g. a "right half of the mirror") according to the invention, depending on the position in which the mirror to be tested is relative to the CGH, with these two test waves precisely being provided by the CGH that was complex-encoded in an appropriate manner.

On account of the combination according to the invention of a plurality of use functionalities in one and the same CGH, said functionalities being assigned to different geometric regions of the mirror to be tested, a test can also be realized in the case of large concave mirrors or large GI mirrors without interchanging the CGH by virtue of only the relevant mirror or test object being moved while there is an unchanged position of the CGH, with the consequence that, in the overlapping region, the measurement results that are obtained for different mirror regions and assigned to the respective use functionalities only differ by the degrees of freedom in terms of the adjustment of the test object.

In particular, the invention has the advantage that only a single CGH is required, even when testing comparatively large mirror surfaces, and said CGH moreover remains at the same position such that, inter alia, a possibly repeated CGH adjustment for different mirror positions within the test arrangement is dispensed with.

A further advantage consists of a significant reduction in the time duration that is required for testing even relatively large mirror surfaces, which emerges immediately from dispensing with conventional procedures for CGH interchange and the adjustment steps, etc. accompanying this.

In embodiments of the invention, the second test wave differs from the first test wave. Moreover, the mirror may be constituted in such a way that the second portion of the mirror does not emerge from the first portion of the mirror by way of a symmetry operation (as would be the case, for example, in the case of a present rotational symmetry of the mirror). Thus, on account of providing different test waves by the computer-generated hologram (CGH), with surface regions or mirror surfaces that differ from one another in each case being assigned one of these test waves, the invention facilitates the testing of freeform mirror surfaces which have no intrinsic symmetry.

In accordance with an embodiment, the computer-generated hologram (CGH) for providing the first test wave and the second test wave has a complex encoding of CGH structures that differ from one another.

In accordance with an embodiment, the computer-generated hologram (CGH) is further designed in such a way that the respective intensities of the first test wave and of the second test wave differ by no more than 20%, in particular by no more than 10%, from one another.

In accordance with an embodiment, the computer-generated hologram (CGH) is further designed in such a way that, during operation of the appliance, it provides at least one calibration wave for the interferometric superposition with a reference wave after the reflection of this calibration wave at a calibration mirror.

In accordance with an embodiment, the computer-generated hologram (CGH) is further designed in such a way that, during operation of the appliance, it provides at least two calibration waves, in particular at least three calibration waves, for the interferometric superposition with a reference wave after the reflection of these calibration waves at calibration mirrors that differ from one another.

The invention further also relates to a method for testing a mirror, in particular a mirror of a microlithographic projection exposure apparatus, wherein the method comprises the following steps:

recording a first interferogram between a first test wave that is reflected at the mirror and a reference wave;

recording a second interferogram between a second test wave that is reflected at the mirror and a reference wave;

wherein the first test wave and the second test wave are directed onto the mirror by the same computer-generated hologram (CGH); and wherein the position of the mirror is modified between the recording of the first interferogram and the recording of the second interferogram.

In accordance with an embodiment, the first test wave is reflected at a first portion of the mirror and the second test wave is reflected at a second portion of the mirror that is different from the first portion.

In accordance with an embodiment, the mirror is displaced and/or twisted about a predetermined axis (e.g. the gravitational axis, depending on the application) between the recording of the first interferogram and the recording of the second interferogram.

In accordance with an embodiment, the computer-generated hologram (CGH) remains in the same position during the recording of the first interferogram and of the second interferogram.

Further configurations of the invention can be gathered from the description and the dependent claims.

The invention is explained in greater detail below on the basis of exemplary embodiments illustrated in the accompanying figures.

DETAILED DESCRIPTION

Figure 7:
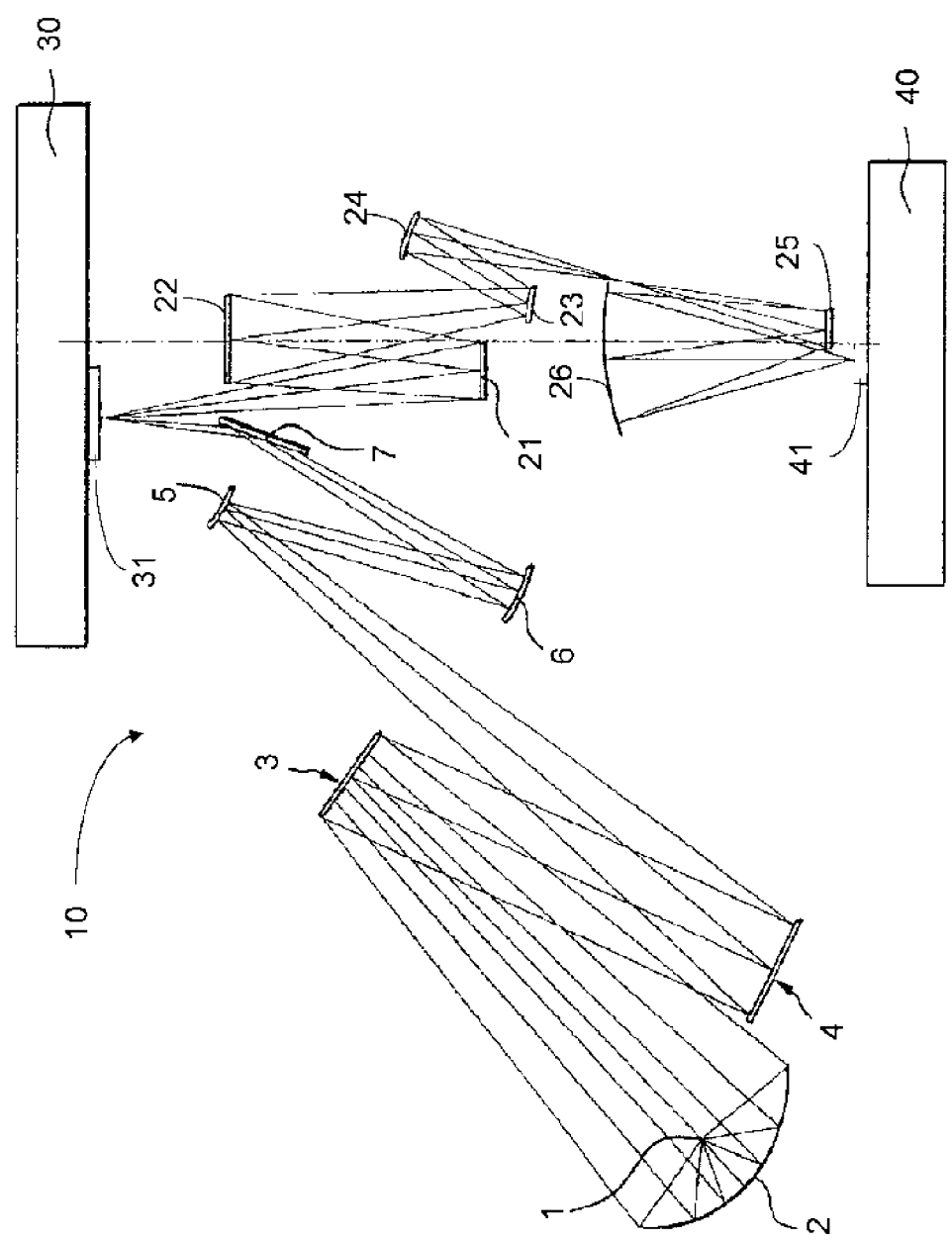
FIG. 7 shows a schematic illustration of a projection exposure apparatus designed for operation in EUV.

FIG. 7 shows a schematic illustration of an exemplary projection exposure apparatus which is designed for operation in extreme ultraviolet (EUV) light and which comprises mirrors which are testable by a method according to the invention.

According to FIG. 7, an illumination device in a projection exposure apparatus 10 designed for EUV comprises a field facet mirror 3 and a pupil facet mirror 4. The light from a light source unit comprising a plasma light source 1 and a collector mirror 2 is directed onto the field facet mirror 3. A first telescope mirror 5 and a second telescope mirror 6 are arranged in the light path downstream of the pupil facet mirror 4. A deflection mirror 7 is arranged downstream in the light path, said deflection mirror directing the radiation that is incident on it onto an object field in the object plane of a projection lens comprising six mirrors 21-26. At the location of the object field, a reflective structure-bearing mask 31 is arranged on a mask stage 30, said mask being imaged with the aid of the projection lens into an image plane in which a substrate 41 coated with a light-sensitive layer (photoresist) is situated on a wafer stage 40.

The mirror that is tested within the scope of the invention can be e.g. any mirror of the projection exposure apparatus 10, for example the mirrors 21 or 22 of the projection lens, or else the mirror 7 of the illumination device.

Next, a principle underlying the invention will be described below with reference to the schematic depictions in FIG. 1 and FIG. 2.

Figure 1:
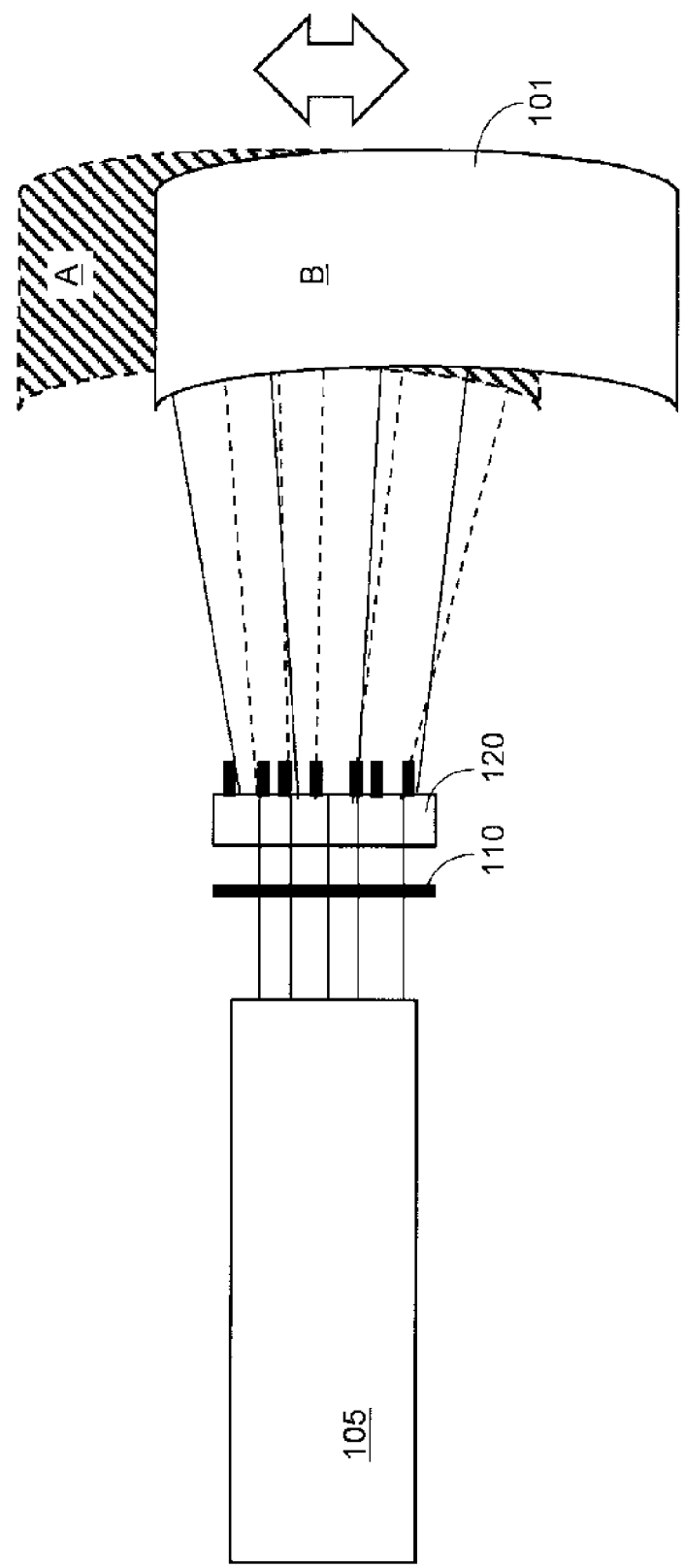
FIGS. 1-4 show schematic illustrations for explaining exemplary embodiments of the present invention.
Figure 5:
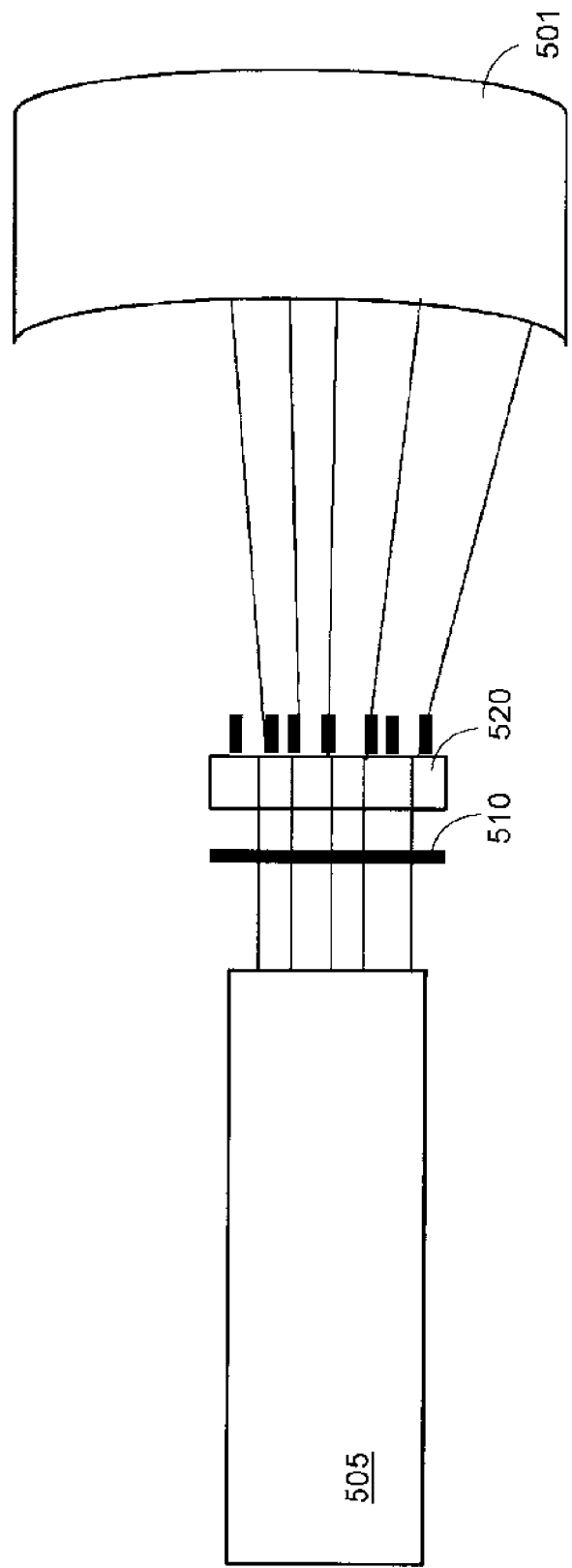
FIGS. 5-6 show schematic illustrations for explaining a conventional functional principle of an interferometric test appliance for testing a mirror.
Figure 6:
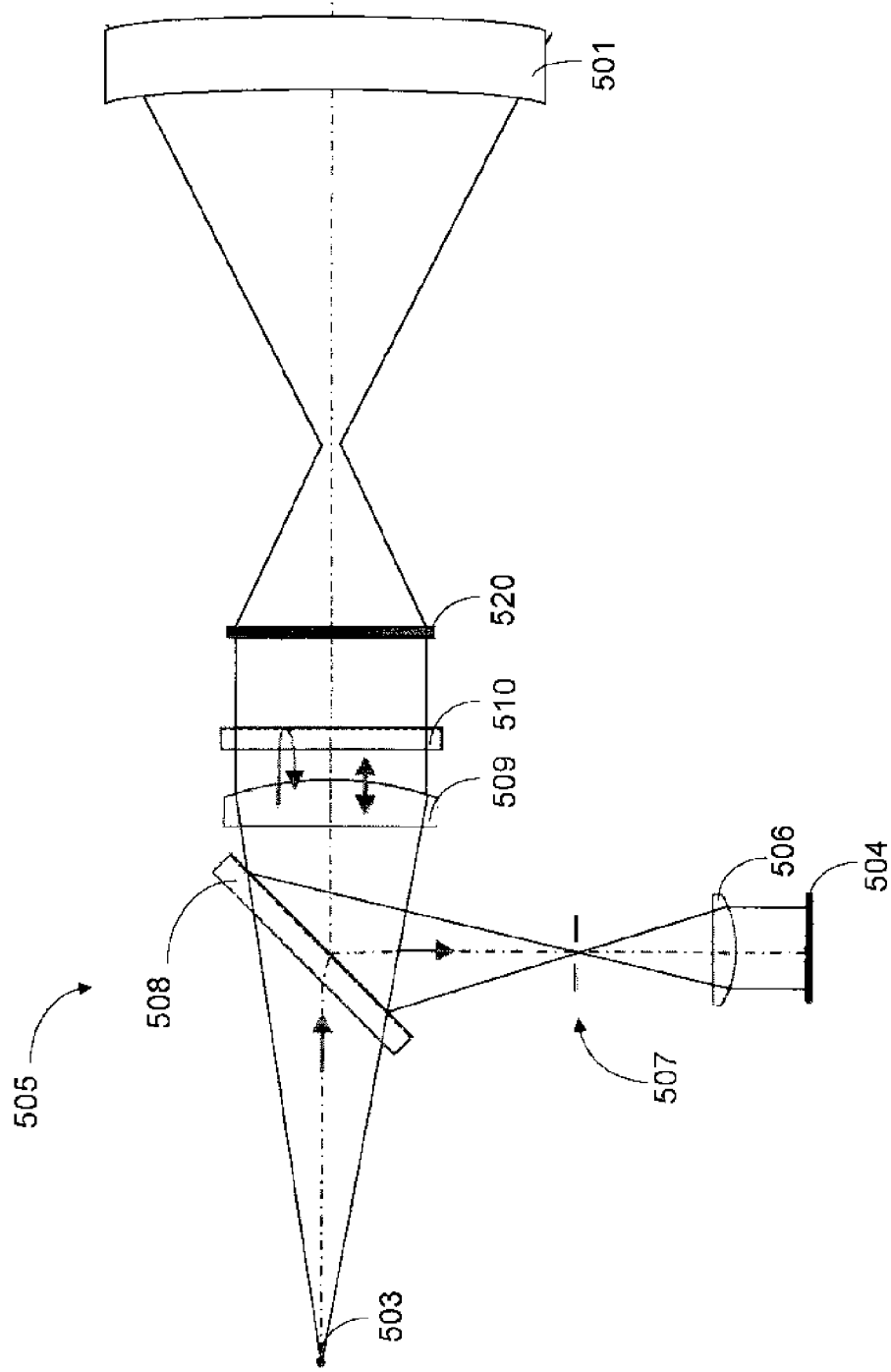

Proceeding from the Fizeau arrangement that has already been described on the basis of FIG. 5, FIG. 1 firstly shows a schematic illustration for explaining the testing of a mirror 101 using the reference light that is reflected at a reference surface 110 ("Fizeau plate") and the measurement light that is reflected at the mirror 101 to be tested, wherein the measurement light is formed to make a wavefront with a computer-generated hologram (CGH) 120. The wavefront corresponds mathematically exactly to the "test form" (i.e. the form of the relevant mirror 101) at an intended distance. The wavefronts that are reflected, firstly, by the reference surface 110 and, secondly, by the corresponding mirror 101, or test object, interfere with one another in an interferometer 105 which, for example, can have the overall structure already explained on the basis of FIG. 6.

According to the invention, the mirror 101 is tested using one and the same CGH 120 for the entire mirror surface of the mirror 101 to be tested, for the purposes of which the mirror 101 is moved in different positions within the test appliance (as indicated in FIG. 1 by the double-headed arrow). FIG. 1 indicates, in a purely schematic manner, two different positions "A" and "B".

Figure 2:
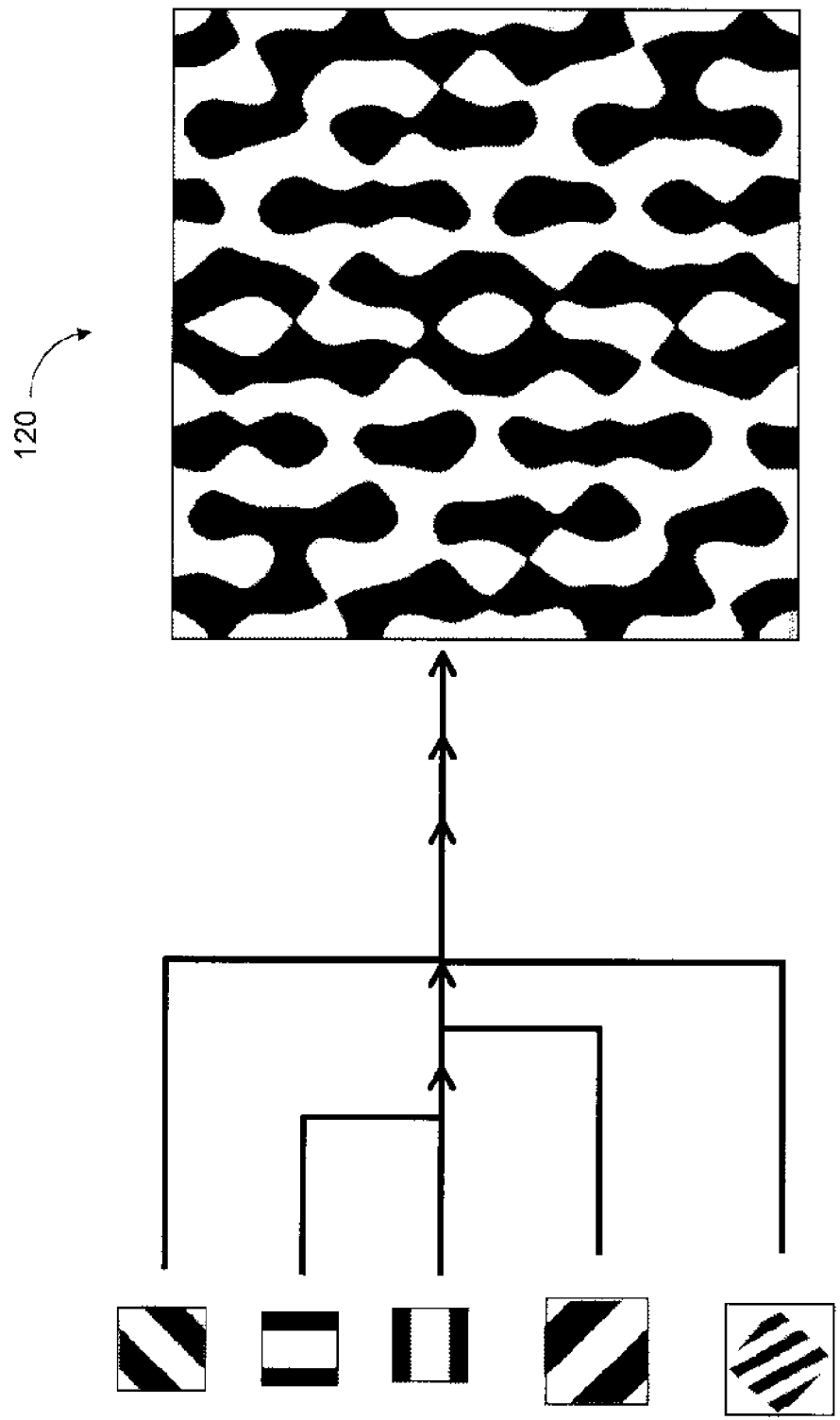

In each case, (in view of the assumed large mirror surface) only a portion of the entire mirror surface is tested within the test appliance in these different mirror positions "A" and "B", the CGH 120 being equipped with a plurality of different CGH structures or use functionalities for this test, in accordance with the schematic diagram shown in FIG. 2. As indicated in FIG. 2, these CGH structures or use functionalities can typically be (locally varying) line gratings with different orientations or grating periods.

Expressed differently, the CGH 120 has both a first CGH structure or use functionality that is suitable for testing a first mirror region (when the mirror 101 is in the position "A") and a CGH structure or use functionality that is suitable for testing a second mirror region (corresponding to the position "B" of the mirror 101).

These CGH structures or use functionalities are realized in the CGH 120 by way of the method of complex encoding, which is known per se. Here, the respective CGH structures or line gratings may each be described by a phase function (with amplitude and phase), wherein the relevant terms may be added, optionally with different weightings. A complex function, which may, in turn, be binarized, emerges in this way, whereby e.g. the resultant structure of the CGH 120 that is depicted merely schematically for a specific point on the CGH in the right-hand part of FIG. 2 is obtained.

Here, in particular, the relevant resultant overall structure of the CGH 120 that is schematically depicted in the right-hand part of FIG. 2 is distinguished by virtue of a multiplicity of test waves being provided for one and the same test object or mirror as a consequence of the complex encoding described above, with these test waves being assigned to portions of the mirror that differ from one another, i.e. facilitating by way of a displacement of the mirror 101 relative to the CGH 120 an interferometric test of even a comparatively large mirror surface that is combined from the respective portions when one and the same CGH 120 is used.

In tables 1a and 1b below, exemplary embodiments for the above-described possible weighting of the individual CGH structures are specified.

As can be seen in each case from table 1a and table 1b, the termed (by way of "grating 1" and "grating 2") line gratings of the use functionalities (i.e. of the CGH structures for testing the individual portions of the mirror 101) are relatively strongly weighted here relative to the termed (by way of "grating 3" to "grating 5") calibration functionalities, wherein, moreover, the weighting of the two use functionalities, or "grating 1" and "grating 2", relative to one another is in correspondence (or deviate only slightly from one another, e.g. less than 20%, in particular less than 10% in respect of the respectively stronger weighting in further embodiments). In addition to the aforementioned two use functionalities or CGH structures, further (use or else calibration) functionalities are encoded on the CGH 120 in the exemplary embodiment (grating 3, grating 4 and grating 5 in tables 1a and 1b).

TABLE 1a

| Grating | Weighting | Intensity of the 1st order | Reflectivity of the mirror | Overall intensity after CGH (two passes) + mirror |
|---|---|---|---|---|
| 1 | 40 | 11% | 4.00% | 0.05% |
| 2 | 40 | 11% | 4.00% | 0.05% |
| 3 | 20 | 2.5% | 80.00% | 0.05% |
| 4 | 20 | 2.5% | 80.00% | 0.05% |
| 5 | 20 | 2.5% | 80.00% | 0.05% |

TABLE 1b

| Grating | Weighting | Intensity of the 1st order | Reflectivity of the mirror | Overall intensity after CGH (two passes) + mirror |
|---|---|---|---|---|
| 1 | 50 | 12% | 4.00% | 0.06% |
| 2 | 50 | 12% | 4.00% | 0.06% |
| 3 | 20 | 1.8% | 80.00% | 0.03% |
| 4 | 20 | 1.8% | 80.00% | 0.03% |
| 5 | 20 | 1.8% | 80.00% | 0.03% |

In the exemplary embodiment of FIG. 2, the CGH 120 has a total of five different functionalities or CGH structures as a consequence of the complex encoding, wherein, merely in an exemplary manner, two of these CGH structures may serve to test different mirror regions (when positioning the mirror 101 in the mirror positions "A" and "B" that are depicted on the basis of FIG. 1) and wherein the remaining three CGH structures may serve as calibration functionalities.

Figure 3:
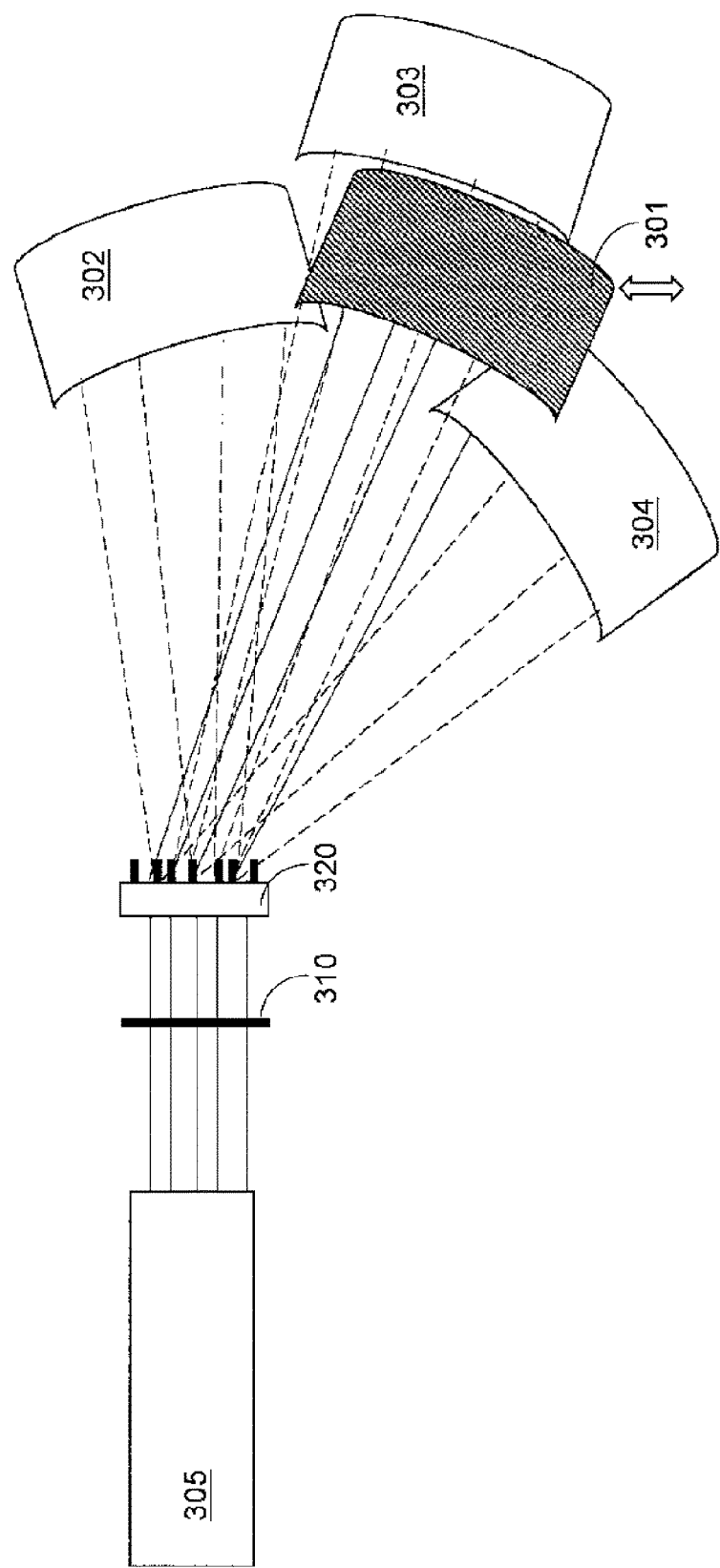

To this end, FIG. 3 shows a schematic illustration, wherein components which are analogous or substantially functionally identical to FIG. 1 are denoted by reference signs increased by "200". The test appliance in accordance with FIG. 3 has a total of three calibration mirrors 302, 303 and 304, to each of which one of the above-described calibration functionalities of the CGH 320 is assigned. As already described above, the mirror 301 is moved to different positions within the test appliance (as indicated by the double-headed arrow in FIG. 3) for the purposes of testing different mirror regions, wherein the use functionality of the CGH 320 that is designed in accordance with the respective mirror region or assigned to the latter is used for testing purposes.

In accordance with a further aspect of the invention, the testing of a mirror using one and the same CGH (and moving or displacing the mirror position relative to this CGH) can also be used to reduce or largely eliminate the influence of unwanted disturbing reflections on the test result. Such disturbing reflections typically result from the fact that, in addition to the wanted test wave that impinges on the mirror surface by way of diffraction at the respective CGH structures and that is reflected by said mirror surface, further orders of diffraction that are, however, not wanted during the test also return on the same path as the desired test waves likewise after the reflection at the mirror surface, either randomly or on account of unavoidable errors within the CGH structure, and said further orders of diffraction are likewise able to contribute to the produced interferogram.

Figure 4:
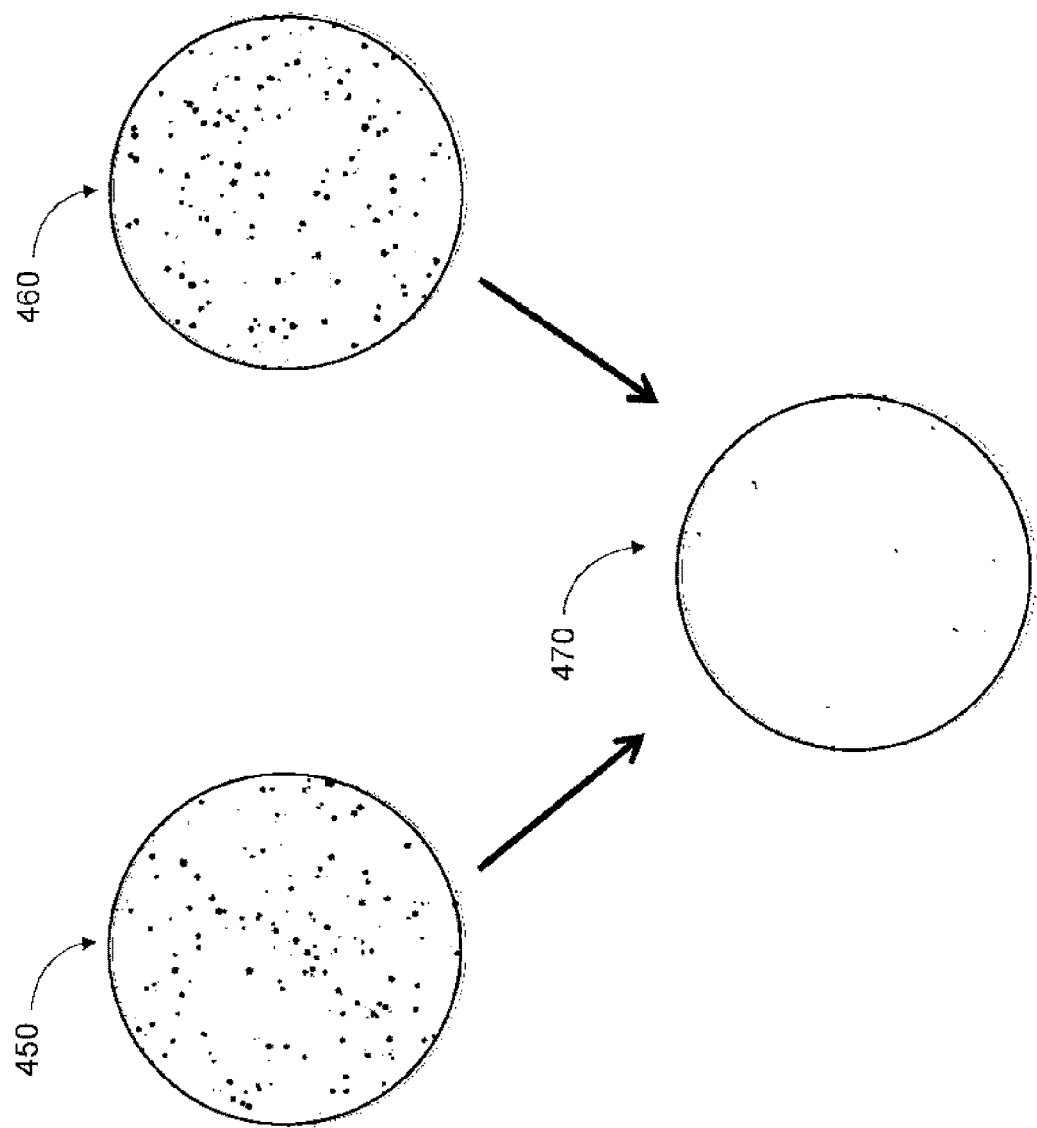

Now, in order to overcome or reduce this problem, it is possible, according to the invention, to carry out the interferometric measurement with one and the same CGH for e.g. two mirror positions that are rotated or slightly displaced with respect to one another, wherein, as indicated in FIG. 4, an "or operation" of the two obtained interferograms 450, 460 is subsequently carried out, with the consequence that the distribution 470 that results from this or operation is at least largely freed from the influence of disturbing reflections ("speckled pattern").

Hence, in the exemplary embodiment described above, the use of one and the same CGH in conjunction with two different mirror positions relative to the CGH may also be advantageously used in applications in which the CGH facilitates a direct testing of the entire mirror surface in a single step (i.e. without partial steps for individual portions of the mirror) even on account of the size and design.

A further advantageous aspect of the complex encoding of a CGH with a plurality of use functionalities according to the invention is that such a CGH (as e.g. shown in FIG. 2) also facilitates the testing of freeform mirror surfaces (which have no intrinsic symmetry), with use also being made here of the fact that different use functionalities can be encoded, or different line gratings can be written, onto one and the same position on the CGH.

The provision according to the invention of at least two use functionalities on one and the same position of the CGH may further—as an alternative to measuring different portions of the mirror—also be used to measure different mirror geometries, in which case the individual use functionalities or CGH structures are not assigned to different portions of the same mirror in this case, but are assigned to different mirrors.

Moreover, the provision of at least two use functionalities need not be effectuated on the entire CGH surface, and so the use functionalities may also in each case only be written to a portion of the CGH. In this case, the optionally present calibration functionality must comprise the respective portions of the use functionalities.

Moreover, the invention is not restricted to a specific number of use functionalities or a specific number of calibration functionalities corresponding to the embodiments described above, and so, in particular, more than two use functionalities or CGH structures, which may be assigned to one of a plurality of portions of the mirror in each case, are also possible.

Even though the invention has been described on the basis of specific embodiments, numerous variations and alternative embodiments are apparent to a person skilled in the art, e.g. by combination and/or exchange of features of individual embodiments. Accordingly, such variations and alternative embodiments are concomitantly encompassed by the present invention, and the scope of the invention is restricted only within the meaning of the appended patent claims and equivalents thereof.

What is claimed is:

1. A test appliance for testing a mirror, comprising:
a computer-generated hologram (CGH) configured to carry out a test on at least a portion of the mirror by interferometrically superposing a test wave that is directed onto the mirror by the computer-generated hologram and a reference wave,
wherein the computer-generated hologram is configured to provide, during operation of the appliance, a first test wave for testing a first portion of the mirror by interferometric superposition with a first reference wave in a first position of the mirror and at least a second test wave for testing a second portion of the mirror by interferometric superposition with a second reference wave in a second position of the mirror; and
wherein the computer-generated hologram comprises a complex encoding of a first computer-generated structure and a second computer-generated structure such that the first computer-generated structure provides the first test wave and the second computer-generated structure provides the second test wave; and
wherein the first test wave and the second test wave are different test waves.

2. The test appliance as claimed in claim 1, wherein the computer-generated hologram is further configured to weight respective intensities of the first test wave and of the second test wave differently from one another by no more than 20%.

3. The test appliance as claimed in claim 2, wherein the computer-generated hologram is further configured to weight respective intensities of the first test wave and of the second test wave differently from one another by no more than 10%.

4. The test appliance as claimed in claim 1, wherein the computer-generated hologram is further configured to provide, during operation of the appliance, at least one calibration wave for the interferometric superposition with a reference wave after reflection of the calibration wave at a calibration mirror.

5. The test appliance as claimed in claim 4, wherein the computer-generated hologram is further configured to provide, during operation of the appliance, at least two calibration waves for the interferometric superposition with a reference wave after reflection of the calibration waves at calibration mirrors that differ from one another.

6. The test appliance as claimed in claim 5, wherein the computer-generated hologram is further configured to provide, during operation of the appliance, at least three calibration waves for the interferometric superposition with a reference wave after reflection of the calibration waves at calibration mirrors that differ from one another.

7. The test appliance as claimed in claim 1, wherein the mirror is a mirror of a microlithographic projection exposure apparatus.

8. The test appliance as claimed in claim 1, wherein the first reference wave and second reference wave comprise different reference waves.

9. A method for testing a mirror, comprising:
   directing a first test wave onto a mirror using a computer generated hologram (CGH) having a complex encoding of computer-generated hologram structures;
   recording a first interferogram between a first test wave that is reflected at the mirror and a first reference wave;
   modifying a position of the mirror after recording the first interferogram;
   directing a second test wave onto a mirror using the computer-generated hologram; and
   recording a second interferogram between a second test wave that is reflected at the mirror and a second reference wave,
   wherein the first test wave and the second test wave are different test waves due to the complex encoding of computer-generated hologram structures.

10. The method as claimed in claim 9, wherein the first test wave is reflected at a first portion of the mirror and the second test wave is reflected at a second portion of the mirror that is different from the first portion.

11. The method as claimed in claim 9, wherein modifying the position of the mirror after recording the first interferogram comprises displacing and/or twisting the mirror between the recording of the first interferogram and the recording of the second interferogram.

12. The method as claimed in claim 9, wherein the computer-generated hologram remains in a same position during the recording of the first interferogram and the recording of the second interferogram.

13. The method for testing a mirror as claimed in claim 9, wherein the mirror is a component of a microlithographic projection exposure apparatus.

14. The method of claim 9, wherein the computer-generated hologram is further configured to weight respective intensities of the first test wave and of the second test wave differently from one another by no more than 20%.

15. The method of claim 9, wherein the computer-generated hologram is further configured to weight respective intensities of the first test wave and of the second test wave differently from one another by no more than 10%.

16. The method of claim 9, wherein recording the first interferogram between the first test wave that is reflected at the mirror and the first reference wave comprises interferometric superposition of the first test wave and the first reference wave.

17. The method of claim 9, wherein recording the second interferogram between the first test wave that is reflected at the mirror and the second reference wave comprises interferometric superposition of the second test wave and the second reference wave.

18. The method of claim 9, wherein the first reference wave and second reference wave comprise different reference waves.

* * * * *

UNITED STATES PATENT AND TRADEMARK OFFICE
CERTIFICATE OF CORRECTION

| | |
|---|---|
| PATENT NO. | : 10,422,718 B2 |
| APPLICATION NO. | : 15/676729 |
| DATED | : September 24, 2019 |
| INVENTOR(S) | : Stiepan et al. |

Page 1 of 1

It is certified that error appears in the above-identified patent and that said Letters Patent is hereby corrected as shown below:

Column 9, Lines 31-32, In Claim 9, Lines 2-3, delete "computer generated" and insert -- computer-generated -- therefor.

Signed and Sealed this
Seventh Day of July, 2020

Andrei Iancu
*Director of the United States Patent and Trademark Office*